United States Patent
Iizuka (10) Patent No.: US 8,758,550 B2
(45) Date of Patent: Jun. 24, 2014

(54) SHOWER HEAD AND PLASMA PROCESSING APPARATUS HAVING SAME

(75) Inventor: Hachishiro Iizuka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 662 days.

(21) Appl. No.: 12/719,502

(22) Filed: Mar. 8, 2010

(65) Prior Publication Data

US 2010/0230052 A1      Sep. 16, 2010

Related U.S. Application Data

(60) Provisional application No. 61/176,540, filed on May 8, 2009.

(30) Foreign Application Priority Data

Mar. 10, 2009   (JP) ................................. 2009-056522

(51) Int. Cl.
*C23C 16/00* (2006.01)
*C23F 1/00* (2006.01)
*H01L 21/306* (2006.01)

(52) U.S. Cl.
USPC ................... 156/345.34; 118/715; 156/345.33

(58) Field of Classification Search
USPC ............. 156/345.33, 345.34, 345.43–345.47; 118/715, 723 E
See application file for complete search history.

(56) References Cited

U.S. PATENT DOCUMENTS

| 4,209,357 | A | * | 6/1980 | Gorin et al. ................... 438/710 |
| 5,981,899 | A | * | 11/1999 | Perrin et al. ............. 219/121.52 |
| 6,818,096 | B2 | * | 11/2004 | Barnes et al. ............ 156/345.43 |
| 7,786,435 | B2 | * | 8/2010 | Whitehouse et al. ......... 250/292 |
| 7,886,690 | B2 | * | 2/2011 | Ellingboe ................. 118/723 E |
| 2003/0015658 | A1 | * | 1/2003 | Felter ............................. 250/292 |
| 2003/0137250 | A1 | * | 7/2003 | Mitrovic .................. 315/111.21 |
| 2004/0149216 | A1 | | 8/2004 | Osada et al. |
| 2006/0137820 | A1 | * | 6/2006 | Lee et al. ................. 156/345.37 |
| 2006/0266852 | A1 | * | 11/2006 | Choi ............................. 239/548 |

FOREIGN PATENT DOCUMENTS

JP   2004-165460   6/2004

* cited by examiner

*Primary Examiner* — Rakesh Dhingra
(74) *Attorney, Agent, or Firm* — Rothwell, Figg, Ernst & Manbeck, P.C.

(57) ABSTRACT

A shower head is provided, in a processing chamber in which a substrate is processed, to face a mounting table for mounting the substrate thereon. The shower head includes: a facing surface that faces the mounting table to supply a gas to the substrate in a form of shower through a plurality of gas injection holes formed on the facing surface; an opposing surface provided opposite to the facing surface; a plurality of gas exhaust holes extending between the facing surface and the opposing surface to perform gas exhaust from the facing surface toward the opposing surface; and a plurality of electrodes provided on the opposing surface, an ion-confining voltage being applied to the electrodes.

9 Claims, 6 Drawing Sheets

SHOWER HEAD AND PLASMA PROCESSING APPARATUS HAVING SAME

CROSS-REFERENCE TO RELATED APPLICATIONS

This application claims priority to Japanese Patent Application No. 2009-056522 filed on Mar. 10, 2009, the entire contents of which are incorporated herein by reference.

FIELD OF THE INVENTION

The present invention relates to a shower head provided in a processing chamber in which a substrate is processed and supplying a gas toward the substrate in a form of shower, and a plasma processing apparatus having same.

BACKGROUND OF THE INVENTION

Typically, in the manufacture of semiconductor devices or the like, a shower head has been used to supply a gas toward a substrate such as a semiconductor wafer or the like in a form of shower. For example, in a plasma processing apparatus for performing a plasma etching process on a substrate such as a semiconductor wafer or the like, a mounting table for mounting the substrate thereon is provided inside a processing chamber and a shower head is provided to face the mounting table. In the shower head, a plurality of gas injection holes is formed on a facing surface that faces the mounting table and a gas is injected toward the substrate through the gas injection holes in a form of shower.

In the plasma processing apparatus, a plasma generated in the processing chamber needs to be confined in a defined processing space. Accordingly, there has been disclosed a plasma processing apparatus in which the processing space of a processing chamber is provided with a plasma-confining baffle plate (see, e.g., Japanese Patent Application Publication No. 2004-165460 and corresponding U.S. Application Publication No. 2004-0149216 A1).

The above-described plasma etching apparatus is typically configured to exhausts the processing chamber through a lower portion thereof, so that a gas supplied from the shower head flows toward a lower side of the mounting table. For that reason, the plasma generated in the processing chamber tends to diffuse, according to the gas flow, around the mounting table and from around the mounting table toward a lower portion thereof. The conventional plasma-confining technique is to prevent such plasma diffusion.

In the meantime, the present inventors have been developing a shower head serving as not only a gas supply unit through which a gas can be supplied but also a gas exhaust unit having a plurality of gas exhaust holes through which gas exhaust is performed, to thereby improve the uniformity of gas flow. In the processing chamber, the gas flows from an upper side to a lower side in the space having such a shower head between the mounting table and the shower head and also from the lower side to the upper side. As a result, such gas flow is completely different from that in the conventional plasma processing apparatus. Accordingly, the above-described conventional confining method may not be employed in the apparatus equipped with such a shower head.

Therefore, it is required to develop a technique capable of preventing plasma dispersion for a shower head having exhaust holes through which gas exhaust is upwardly performed and a plasma processing apparatus having same.

SUMMARY OF THE INVENTION

In view of the above, the present invention provides a shower head and a plasma processing apparatus having same, capable of preventing a plasma dispersion to efficiently uniformly perform a plasma treatment, wherein gas supply and gas exhaust are carried out through the shower head.

In accordance with an aspect of the present invention, there is provided a shower head provided, in a processing chamber in which a substrate is processed, to face a mounting table for mounting the substrate thereon. The shower head includes: a facing surface that faces the mounting table to supply a gas to the substrate in a form of shower through a plurality of gas injection holes formed on the facing surface; an opposing surface provided opposite to the facing surface; a plurality of gas exhaust holes extending between the facing surface and the opposing surface to perform gas exhaust from the facing surface toward the opposing surface; and a plurality of electrodes provided on the opposing surface, an ion-confining voltage being applied to the electrodes.

In accordance with another aspect of the present invention, there is provided a plasma processing apparatus equipped with such a shower head.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

An embodiment of the present invention will now be described with reference to the accompanying drawings which form a part hereof.

Figure 1:
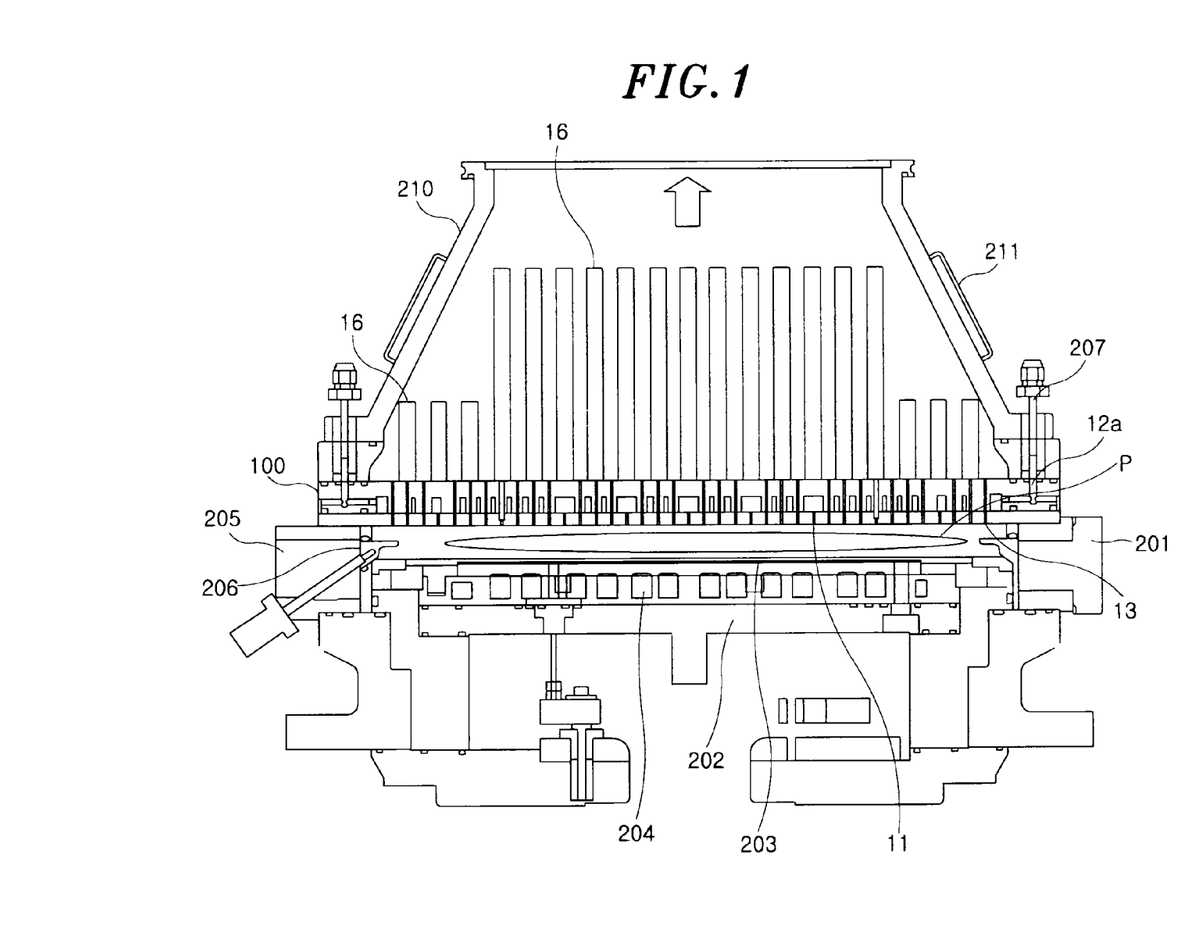
FIG. 1 is a cross sectional view showing a structure of a plasma processing apparatus in accordance with an embodiment of the present invention.
Figure 2:
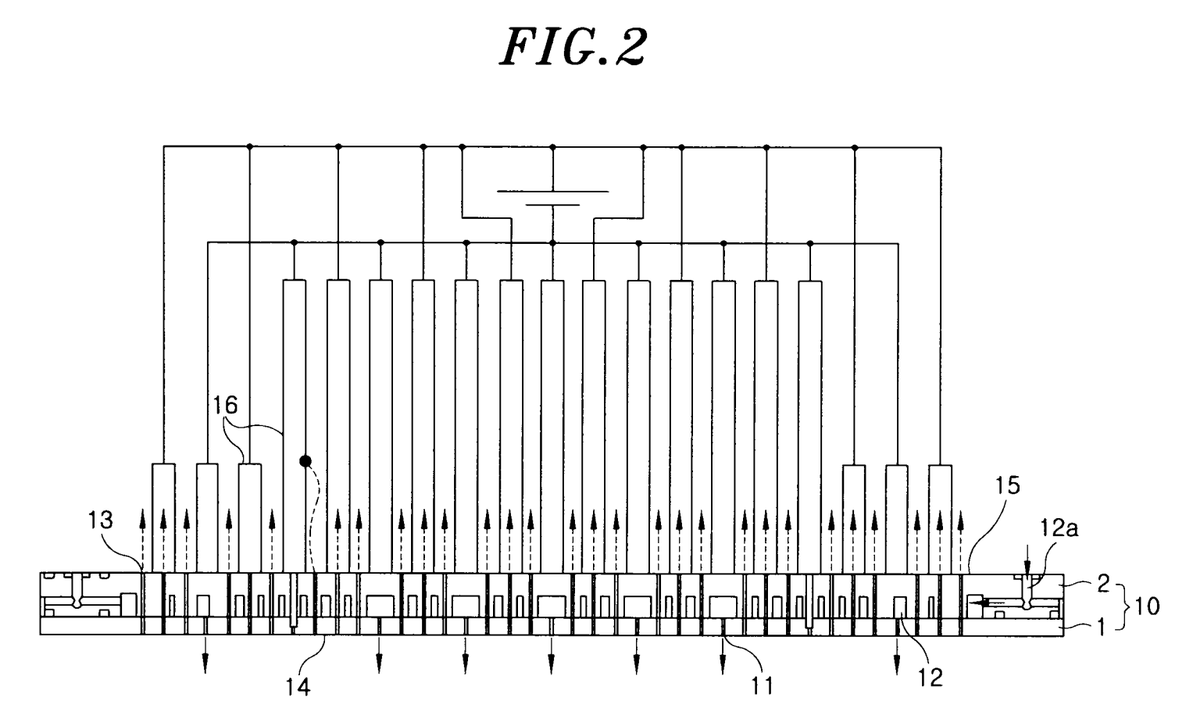
FIG. 2 is a cross sectional view showing a structure of a shower head in accordance with the embodiment of the present invention.

As shown in FIG. 2, the shower head 100 includes a laminated body 10 in which a plate shaped bottom member 1 and a plate shaped top member 2 are laminated, the top member 2 being arranged above the bottom member 1. The plate shaped members 1 and 2 are made of, e.g., an aluminum or the like, the surface of which is anodically oxidized. As shown in FIG. 1, in a processing chamber 201 of the plasma etching apparatus 200, the shower head 100 is arranged to face the mounting table 202 on which a semiconductor wafer (substrate) is mounted. In other words, the bottom member 1 shown in FIG. 2 provides a facing surface 14 that faces the mounting table 202 shown in FIG. 1.

A plurality of gas injection holes 11 is formed in the bottom member 1 of the laminated body 10 providing the facing surface 14 that faces the mounting table 202. Moreover, gas channels 12 communicating with the gas injection holes 11 are formed between the bottom and the top member 1 and 2. Such gas injection holes 11 are formed to supply a gas toward the substrate (lower side in FIG. 2) in a form of shower as illustrated by arrows in FIG. 2. Provided at a peripheral portion of the laminated body 10 is a gas inlet portion 12a from which the gas is introduced into the gas channels 12.

A plurality of gas exhaust holes 13 is formed in the laminated body 10, i.e., the bottom and top member 1 and 2, to extend therethrough. The gas exhaust holes 13 constitutes a gas exhaust unit that performs the gas exhaust, allowing a gas to flow from the substrate side (lower side in FIG. 2) to a side (upper side in FIG. 2) opposite to the substrate 12 as illustrated by dotted-line arrows in FIG. 2.

Figure 3:
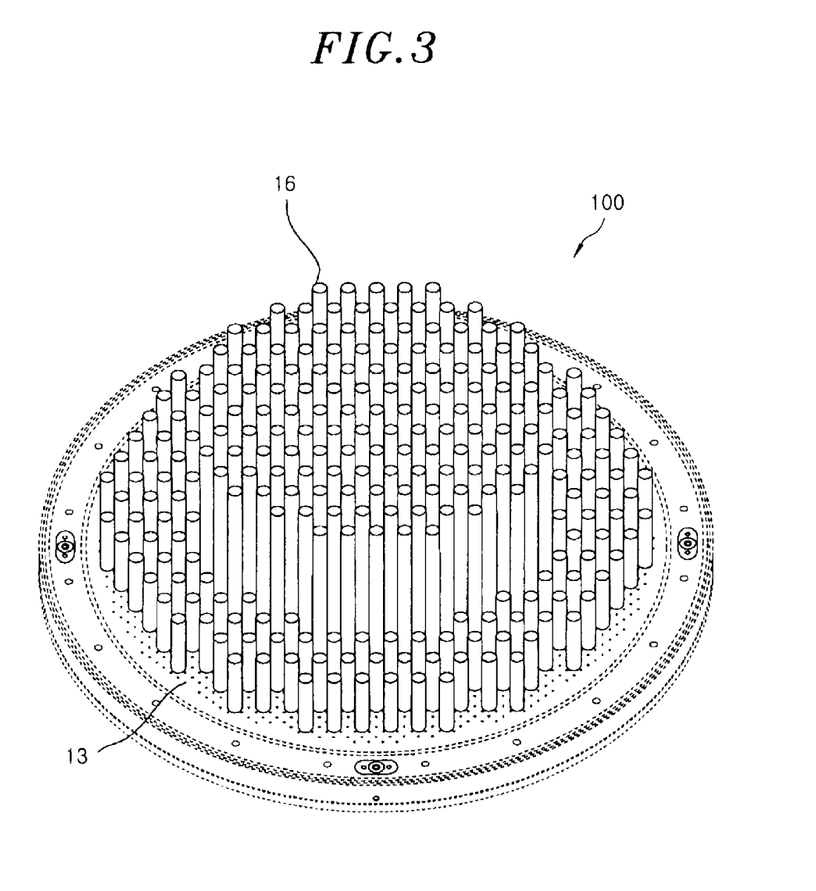
FIG. 3 is a perspective view showing the shower head in accordance with the embodiment of the present invention.

The gas exhaust holes 13 have a diameter of, e.g., about 3 mm. The gas exhaust holes 13 are substantially uniformly formed over an entire area of the shower head 100, excluding a peripheral portion thereof, which is a joint portion with the processing chamber 201, as shown in FIG. 3. As for the number of the gas exhaust holes 13, the shower head 100 for processing a semiconductor wafer of, e.g., about 10 inches, has about 700 to 1000 gas exhaust holes 13. In this embodiment, as shown in FIG. 3, the outer appearance of the shower head 100 has a circular plate shape conformal to that of the semiconductor wafer serving as a target substrate.

Moreover, a plurality of bar(column)-shaped electrodes 16 is stood on a surface 15 at the top member 2 side of the laminated body 10, i.e., the side opposite to the facing surface 14 that faces the mounting table 202, the electrodes 16 being electrically insulated from the laminated body 10. The electrodes 16, as shown in FIG. 3, are substantially uniformly provided over the entire area of the shower head 100 excluding a peripheral portion thereof, which is a joint portion with the processing chamber 201. The outer appearances of the electrodes 16 are not limited to the bar shape. Alternatively, the electrodes 16 may have a barrel or a plate shape.

The electrodes 16 are also made of an electrically conductive material, e.g., copper, stainless steel, or aluminum. Alternatively, the electrodes 16 may be made of an alloy of aluminum or copper in which another element is slightly added to obtain a better mechanical property and/or a better conductivity.

When the electrodes 16 are made of copper, it is preferable to perform a surface treatment. The purpose of the surface treatment is to prevent the unfavorable influence on the semiconductor wafer due to the dispersion of copper from the surfaces of the electrodes 16. As for the number of the electrodes 16, the shower head 100 for processing a semiconductor wafer of, e.g., about 10 inches has about several tens to a hundred and several tens of electrodes 16.

In the electrodes 16, every two adjacent electrodes 16 constitute a pair of electrodes. An ion-confining voltage is applied between the pair of the electrodes. The ion-confining voltage can be a DC voltage as shown in FIG. 2 or a high frequency voltage if the DC voltage source is replaced with a high frequency voltage source. Alternatively, the ion-confining voltage can be a voltage generated by overlapping a high frequency voltage and a DC voltage as shown in FIG. 4.

Figure 4:
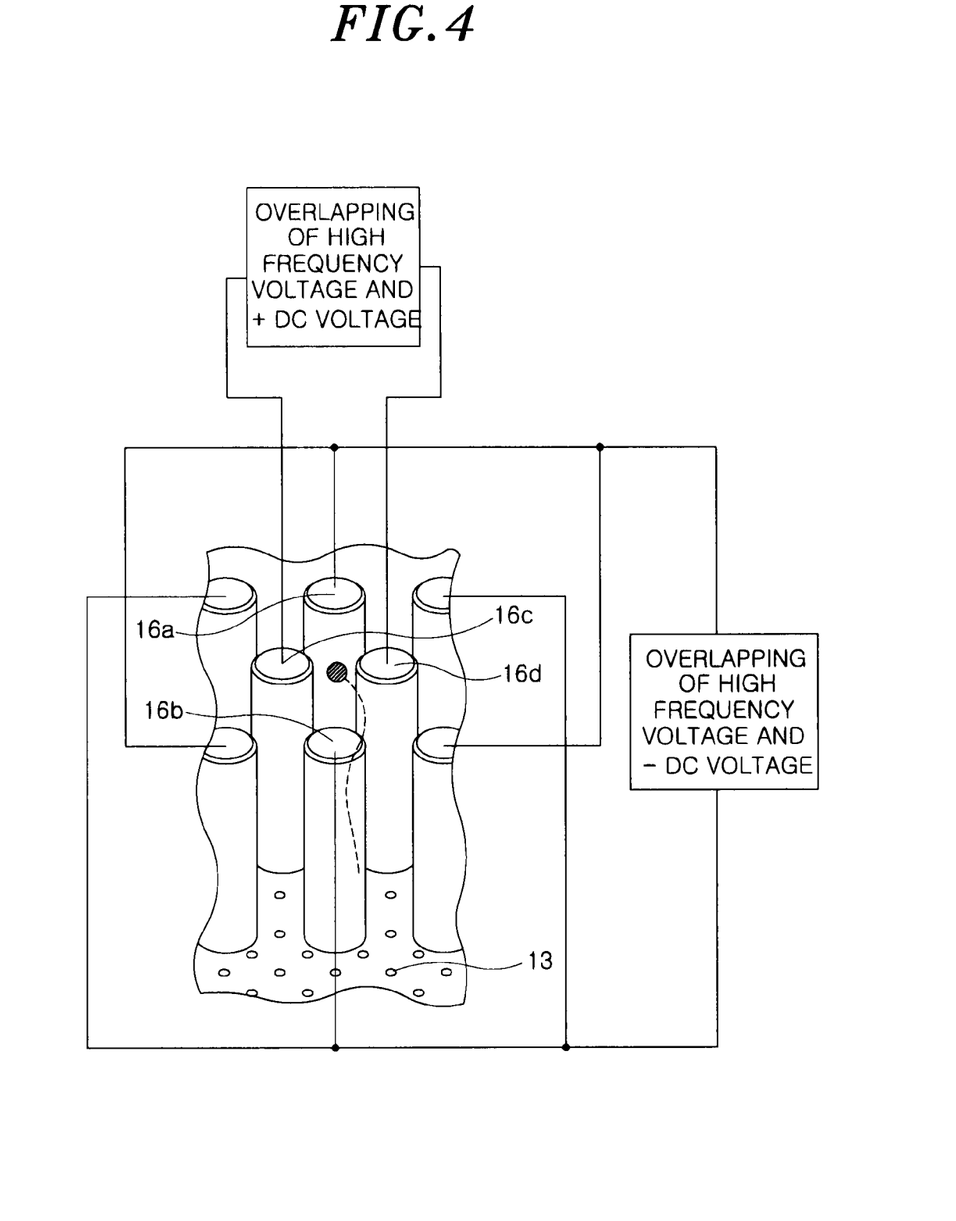
FIG. 4 is a perspective view showing a configuration of main elements of the shower head in accordance with the embodiment of the present invention.
Figure 5:
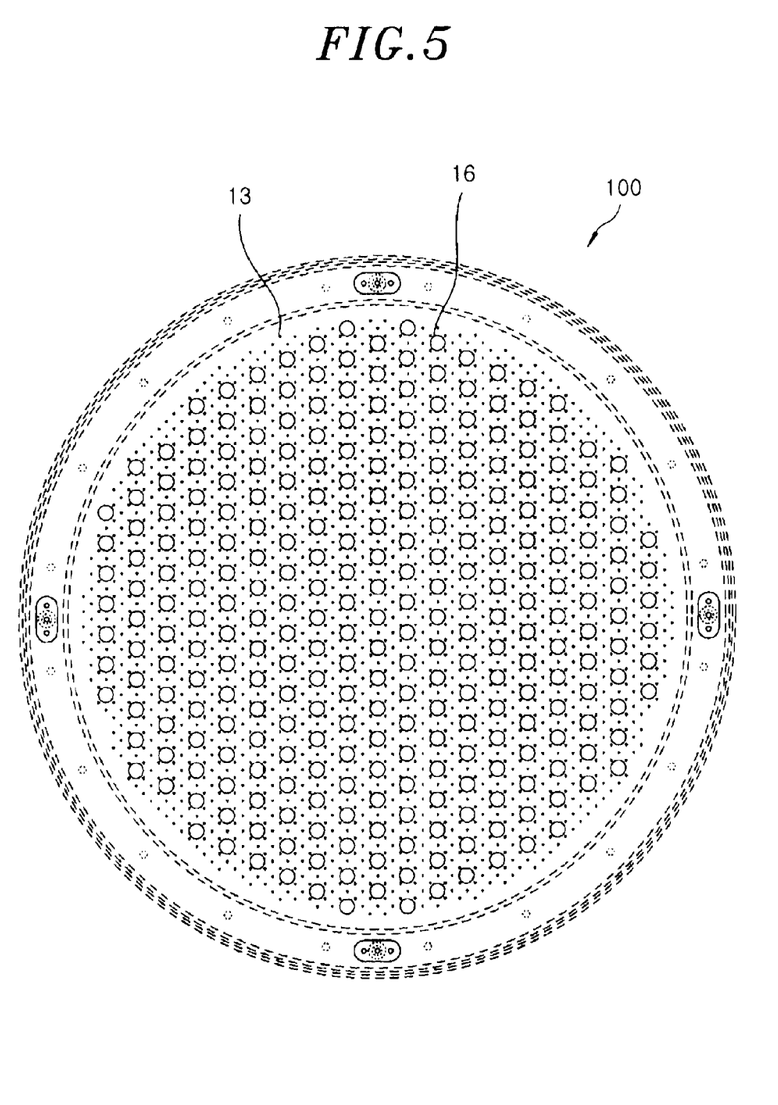
FIG. 5 is a top view showing the shower head in accordance with the embodiment of the present invention.
Figure 6:
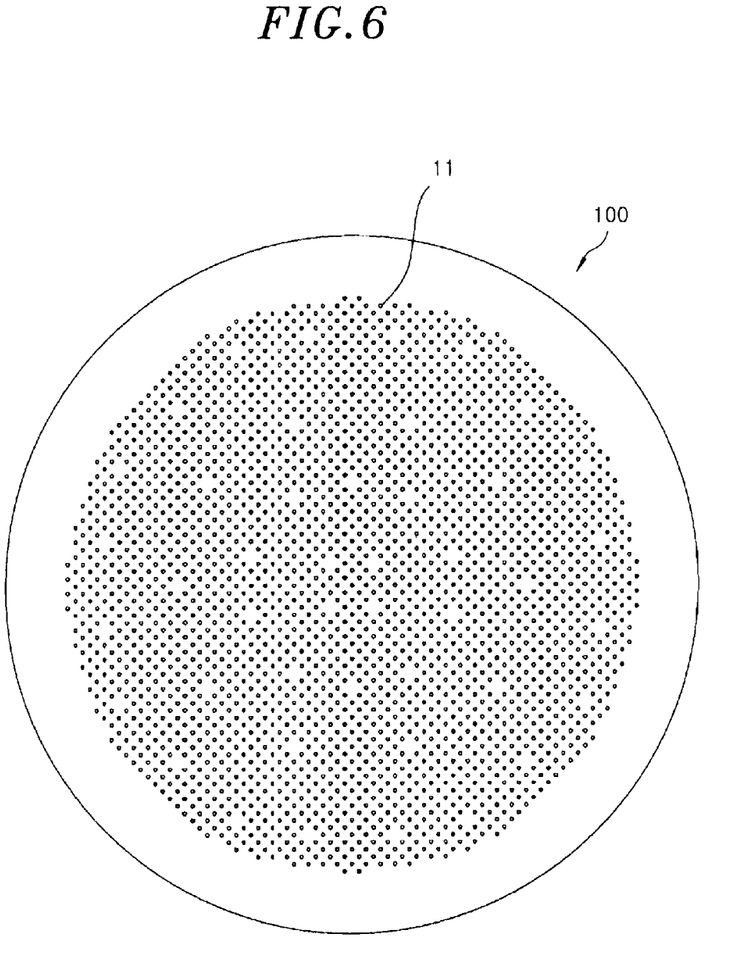
FIG. 6 is a bottom view showing the shower head in accordance with the embodiment of the present invention.

As illustrated by dotted-lines in FIGS. 2 and 4, ions are moved meanderingly by an electric field generated by applying such a voltage between the electrodes 16. Then, the ions become stagnant around the lower side of the electrodes 16 or neutralized by colliding with the electrodes 16.

In the example shown in FIG. 4, every four electrodes, e.g., 16a, 16b, 16c, and 16d, are arranged in a cross form with a common space therebetween; and a voltage generated by overlapping a high frequency voltage and a negative DC voltage is applied between the opposing electrodes 16a and 16b, and a voltage generated by overlapping a high frequency voltage and a positive DC voltage is applied between the opposing electrodes 16c and 16d. Accordingly, the ions are vibrated or neutralized, as in a quadropole mass spectrometer (QMS).

As described above, in accordance with the present embodiment, the bar(column)-shaped electrodes 16 are provided on the surface 15 of the shower head 100 opposite to the facing surface 14 that faces the mounting table 202, and ion-confining voltages are applied to the electrodes 16. Accordingly, it is possible to prevent the ions from diffusing and leaking to a downstream side of an exhaust path.

Furthermore, since the ions in a plasma are stagnant around the surface 15 opposite to the facing surface 14 of the shower head 100, the ions can be prevented from leaking from the facing surface 14 to the surface 15 through the gas exhaust holes 13. Accordingly, the ions can be suppressed from locally leaking toward the exhaust path, thereby not only preventing a plasma density from being nonuniform but also rendering uniform the plasma employed in processing.

Next, the structure of the plasma etching apparatus 200, as an example of the plasma processing apparatus including the shower head 100, will be described with reference to FIG. 1. The plasma etching apparatus 200 is of a capacitively coupled parallel plate type where electrode plates are arranged at an upper and a lower portion, respectively, and a power supply for plasma generation is connected.

The plasma etching apparatus 200 includes the cylindrical processing chamber 201 made of, e.g., aluminum whose surface is anodically oxidized. The processing chamber 201 is grounded. In the processing chamber 201, there is provided the mounting table 202 for mounting a target substrate, such as a semiconductor wafer, thereon and serving as a lower electrode. Furthermore, a high frequency power supply unit (not shown), such as a high frequency power supply, is connected to the mounting table 202.

Provided at an upper side of the mounting table 202 is an electrostatic chuck 203 for holding and attracting the semiconductor wafer thereon. The electrostatic chuck 203 includes insulting members and an electrode provided therebetween. By applying a DC voltage to the electrode, a Coulomb force is generated; hence, the semiconductor wafer is held by and attracted to the electrostatic chuck 203.

Moreover, flow paths 204, through which a temperature control medium is circulated, are formed in the mounting table 202 to adjust to a preset level the temperature of the semiconductor wafer attracted on the electrostatic chuck 203. In the meantime, an opening 205 is formed at a sidewall portion of the processing chamber 201, trough which the semiconductor wafer is loaded to and unloaded from the processing chamber 201. Further, an on-off unit 206 for airtightly blocking the opening 205 is provided thereat.

The shower head 100 shown in FIG. 2 is arranged above the mounting table 202 to be opposite to each other at a predetermined interval. As a result, a pair of opposite electrodes is formed by providing the shower head 100 as an upper electrode and the mounting table 202 as a lower electrode. The gas inlet portion 12a of the shower head 100 is connected to a gas supply unit 207 provided in the processing chamber 201. A predetermined processing gas (etching gas) is supplied from a gas supply mechanism (not shown) to the gas supply unit 207.

Moreover, provided at an upper side of the shower head 100 is a cylindrical member 210 having, e.g., a taper shape that a diameter thereof progressively gets smaller in an upper direction. A vacuum pump (not shown) such as a turbo molecular pump or the like is connected to the cylindrical member 210 via an on-off control valve, an on-off unit and the like.

As such, an inner side of the cylindrical member 210 serves as an exhaust path, and the electrodes 16 are arranged within the exhaust path inside the cylindrical member 210. Further, a temperature control unit 211 for controlling the temperature of the cylindrical member 210 by circulating a temperature control medium is provided at an outer side of the cylindrical member 210.

To perform the plasma etching on the semiconductor wafer by the plasma etching apparatus 200, the semiconductor wafer is firstly loaded into the processing chamber 201 through the opening 205 to be mounted on the electrostatic chuck 203. Then, the semiconductor wafer is held by and attracted to the electrostatic chuck 203. Successively, the opening 205 is closed and the processing chamber 201 is evacuated to a preset vacuum level by the vacuum pump or the like.

Thereafter, a processing gas (etching gas) is supplied at a preset flow rate from the gas supply unit 207 to the gas inlet portion 12a of the shower head 100. Then, the processing gas is injected through the gas channel 12 from the gas injection holes 11 in a form of shower to the semiconductor wafer mounted on the mounting table 202.

The pressure inside the processing chamber 201 is maintained to a preset level and, then, a high frequency power of a preset frequency, e.g., 13.56 MHz, is supplied to the mounting table 202. Accordingly, a high frequency electric field is generated between the shower head 100 serving as the upper electrode and the mounting table 202 serving as the lower electrode. Thus, the etching gas is converted to a plasma by dissociation. The etching process is performed on the semiconductor wafer by the plasma.

In the etching process, the processing gas supplied in a form of shower through the gas injection holes 11 is dispersed to the shower head 100. Then, the processing gas is exhausted through the gas exhaust holes 13. Accordingly, no gas flows from a central portion to a peripheral portion of the semiconductor wafer, unlike the case that the gas is exhausted from a lower portion of the processing chamber 201. Thus, it is possible to make uniform the processing gas supplied to the semiconductor wafer.

Moreover, as described above, by applying the ion-confining voltages to the electrodes 16, the ions in a plasma P inside the processing space of the processing chamber 201 can be suppressed from diffusing through the gas exhaust holes 13 of the shower head 100, thereby uniformly maintaining the state of the plasma P. In other words, local diffusion of parts of ions in the plasma P toward the exhaust path can be prevented, thereby preventing the plasma P from being nonuniform. As a result, a processing can be performed by using the uniform plasma P. Accordingly, an etching treatment can be uniformly performed over an entire area of the semiconductor wafer, thereby improving the in-plane uniformity of processing.

Then, once the plasma etching treatment is completed, the supply of the high frequency power and the processing gas is stopped and the semiconductor wafer is unloaded from the processing chamber 201 in the reverse order.

As described above, since gas exhaust is upwardly performed through the shower head 100 in the plasma etching apparatus 200 of the present embodiment, it is possible to more uniformly supply the processing gas to the semiconductor wafer. Furthermore, the plasma P inside the processing space can be suppressed from leaking to the exhaust path. Therefore, the etching treatment can be uniformly performed over the entire area of the semiconductor wafer.

In addition, it is not required to reduce the diameters of the gas exhaust holes 13 in order to suppress the ions from diffusing to the exhaust path. Moreover, since it is not necessary to scale up the shower head 100 in order to obtain an exhaust conductance, it is not difficult to scale down the processing chamber 200.

Moreover, since the gas exhaust is performed through the gas exhaust holes 13 provided in the plasma etching apparatus 200, it is not necessary to provide an exhaust path around the mounting table 202 or the shower head 100 unlike the conventional method. Accordingly, it is possible to allow the diameter of the processing chamber to more closely approach to an outer diameter of the semiconductor wafer as the target substrate. As a result, it is possible to scale down the plasma etching apparatus 200.

Furthermore, a vacuum pump is provided above the processing chamber 201, so that the gas can be efficiently exhausted through an area closer to a processing space of the processing chamber 201. Accordingly, it is possible to reduce the capacity of the vacuum pump to scale down same.

In accordance with the embodiment of the present invention, it is possible to provide a shower head and a plasma processing apparatus having same, capable of preventing a plasma diffusion to efficiently uniformly perform a plasma treatment, while carrying out gas supply and gas exhaust are carried out through the shower head.

While the invention has been shown and described with respect to the embodiments, it will be understood by those skilled in the art that various changes and modification may be made without departing from the scope of the invention as defined in the following claims.

What is claimed is:

1. A plasma processing apparatus, comprising:
a shower head, provided in a processing chamber in which a substrate is processed, to face a mounting table for mounting the substrate thereon, wherein the shower head includes:
a facing surface that faces the mounting table including a gas supply part to supply a gas from a gas inlet portion provided at a peripheral portion of the showerhead, to the substrate in a form of shower through a plurality of gas injection holes formed on the facing surface;
an opposing surface provided opposite to the facing surface;
a plurality of gas exhaust holes extending between the facing surface and the opposing surface to perform gas exhaust from the facing surface toward the opposing surface; and
a plurality of electrodes provided on the opposing surface, an ion-confining voltage being applied to the electrodes; and
a cylindrical member provided at an upper side of the shower head, the cylindrical member accommodating therein an exhaust path in communication with the gas exhaust holes,
wherein the electrodes are arranged within the exhaust path inside the cylindrical member.

2. The apparatus of claim 1, wherein the shower head and the mounting table serve as opposite electrodes that are opposite to each other.

3. The apparatus of claim 1, wherein the electrodes have a bar or a column shape.

4. The apparatus of claim 1, wherein the electrodes include a pair of electrodes between which a high frequency voltage or a DC voltage serving as the ion-confining voltage is applied.

5. The apparatus of claim 1, wherein the electrodes include two pairs of electrodes, and
wherein a voltage generated by overlapping a high frequency voltage and a positive DC voltage is applied between one pair of the electrodes; and a voltage generated by overlapping a high frequency voltage and a negative DC voltage is applied between the other pair of the electrodes, the first and the second voltage serving as ion-confining voltages.

6. The apparatus of claim 1, wherein electrodes arranged on a central portion of the opposing surface are longer than those arranged on a peripheral portion of the opposing surface.

7. The apparatus of claim 1, wherein the showerhead further includes a laminated body having a plate-shaped top member and a plated-shaped bottom member, and
wherein the facing surface is provided at the bottom member and the opposing surface is provided at the top member.

8. The apparatus of claim 1, wherein the electrodes are electrically insulated from the opposing surface.

9. The apparatus of claim 1, wherein the ion-confining voltage applied to the electrodes is a separate voltage than a voltage applied for plasma generation.

* * * * *